(12) United States Patent
Zhong et al.

(10) Patent No.: US 8,935,595 B2
(45) Date of Patent: Jan. 13, 2015

(54) LDPC ERASURE DECODING FOR FLASH MEMORIES

(75) Inventors: Hao Zhong, Milpitas, CA (US); Yan Li, San Jose, CA (US); Radoslav Danilak, Cupertino, CA (US); Earl T Cohen, Oakland, CA (US)

(73) Assignee: LSI Corporation, San Jose, CA (US)

(*) Notice: Subject to any disclaimer, the term of this patent is extended or adjusted under 35 U.S.C. 154(b) by 68 days.

(21) Appl. No.: 13/583,617

(22) PCT Filed: Mar. 11, 2011

(86) PCT No.: PCT/US2011/028244
§ 371 (c)(1),
(2), (4) Date: Jan. 19, 2013

(87) PCT Pub. No.: WO2011/113034
PCT Pub. Date: Sep. 15, 2011

(65) Prior Publication Data
US 2013/0139035 A1  May 30, 2013

Related U.S. Application Data

(60) Provisional application No. 61/313,681, filed on Mar. 12, 2010.

(51) Int. Cl.
*G06F 11/10* (2006.01)
*G11C 11/56* (2006.01)
(Continued)

(52) U.S. Cl.
CPC ........ *G06F 11/1008* (2013.01); *G11C 11/5642* (2013.01); *G11C 16/10* (2013.01);
(Continued)

(58) Field of Classification Search
CPC .......................... G06F 12/0246; G06F 11/1008
USPC .................................. 714/780, 784, 785, 773
See application file for complete search history.

(56) References Cited

U.S. PATENT DOCUMENTS 5,099,484 A  3/1992  Smelser
5,651,135 A  7/1997  Hatakeya
(Continued)

FOREIGN PATENT DOCUMENTS

KR  10-2010-0010746 A  2/2010
KR  10-2010-0076447 A  7/2010
(Continued)

OTHER PUBLICATIONS

R. Micheloni, L.Crippa, A, Marelli, "InsideNANDFlashMemories" Springer Science +Business Media B.V. 2010 ISBN 978-90-481-9430-8, pp. 38-43 and related footnote pp. 52-53, formatted as 4 sheets.

(Continued)

*Primary Examiner* — Esaw Abraham
(74) *Attorney, Agent, or Firm* — PatentVentures; Bennett Smith; Korbin Van Dyke (57) ABSTRACT

A Solid-State Disk (SSD) controller uses LDPC decoding to enable flash memory accesses with improved latency and/or error correction capabilities. With SLC flash memory having a BER less than a predetermined value, the SSD controller uses a 1-bit read (single read) hard-decision LDPC decoder to access the flash memory. If the hard-decision LDPC decoder detects an uncorrectable error, then the SSD controller uses a 1.5-bit read (two reads) erasure-decision LDPC decoder to access the flash memory. With flash memory having a raw BER between two other predetermined values, the SSD controller omits the use of the hard-decision LDPC decoder and uses only the erasure-decision LDPC decoder to access the flash memory. Variations of the SSD controller similarly access MLC flash memory. Some SSD controllers dynamically switch between hard-decision and erasure-based decoders based on dynamic decoder selection criteria.

13 Claims, 7 Drawing Sheets

(51) Int. Cl.
  *G11C 16/10* (2006.01)
  *G11C 16/26* (2006.01)
  *H03M 13/11* (2006.01)
  *H03M 13/37* (2006.01)

(52) U.S. Cl.
  CPC .......... *G11C 16/26* (2013.01); *H03M 13/1108* (2013.01); *H03M 13/1111* (2013.01); *H03M 13/3707* (2013.01); *H03M 13/3715* (2013.01); *H03M 13/373* (2013.01)
  USPC ............ 714/773; 714/780; 714/784; 714/785

(56) References Cited

U.S. PATENT DOCUMENTS

| | | | |
|---|---|---|---|
| 5,666,512 A | 9/1997 | Nelson et al. | |
| 6,341,085 B1 | 1/2002 | Yamagami et al. | |
| 6,347,051 B2 | 2/2002 | Yamagami et al. | |
| 6,594,728 B1 | 7/2003 | Yeager | |
| 6,678,823 B1 | 1/2004 | Fernandez et al. | |
| 7,117,397 B1 | 10/2006 | Kondo et al. | |
| 7,246,294 B2* | 7/2007 | Kauschke et al. | 714/755 |
| 7,434,135 B2* | 10/2008 | Yoshida | 714/752 |
| 7,656,707 B2 | 2/2010 | Kozlov | |
| 7,681,109 B2 | 3/2010 | Litsyn et al. | |
| 7,739,576 B2 | 6/2010 | Radke | |
| 7,809,994 B2 | 10/2010 | Gorobets | |
| 8,125,827 B2 | 2/2012 | Park | |
| 8,335,977 B2* | 12/2012 | Weingarten et al. | 714/794 |
| 8,418,023 B2* | 4/2013 | Gunnam et al. | 714/758 |
| 8,582,360 B2* | 11/2013 | Park et al. | 365/185.09 |
| 8,595,601 B2* | 11/2013 | Kim et al. | 714/780 |
| 8,667,361 B1* | 3/2014 | Varnica et al. | 714/752 |
| 2005/0240731 A1 | 10/2005 | Steely | |
| 2006/0242542 A1 | 10/2006 | English et al. | |
| 2007/0171714 A1 | 7/2007 | Wu et al. | |
| 2008/0022189 A1 | 1/2008 | Vityaev et al. | |
| 2008/0094907 A1 | 4/2008 | Ban | |
| 2008/0250270 A1 | 10/2008 | Bennett | |
| 2008/0250300 A1 | 10/2008 | Mokhlesi et al. | |
| 2008/0316819 A1 | 12/2008 | Lee | |
| 2009/0003057 A1 | 1/2009 | Kang et al. | |
| 2009/0024905 A1 | 1/2009 | Shalvi et al. | |
| 2009/0177943 A1 | 7/2009 | Silvus et al. | |
| 2009/0241010 A1 | 9/2009 | Yano et al. | |
| 2010/0017649 A1 | 1/2010 | Wu et al. | |
| 2010/0017650 A1 | 1/2010 | Chin et al. | |
| 2010/0020611 A1 | 1/2010 | Park | |
| 2010/0034021 A1 | 2/2010 | Joo | |
| 2010/0091535 A1 | 4/2010 | Sommer et al. | |
| 2010/0100764 A1 | 4/2010 | Kalos | |
| 2010/0131809 A1 | 5/2010 | Katz | |
| 2011/0032760 A1 | 2/2011 | Takagiwa | |
| 2011/0182119 A1 | 7/2011 | Strasser et al. | |
| 2012/0151286 A1 | 6/2012 | Li et al. | |

FOREIGN PATENT DOCUMENTS

| | | |
|---|---|---|
| WO | WO 2008099723 A1 | 8/2008 |
| WO | WO 2009/114618 A2 | 9/2009 |
| WO | 2012/058328 A1 | 5/2012 |
| WO | 2012/075200 A2 | 6/2012 |
| WO | 2012099937 A2 | 7/2012 |
| WO | 2013166200 A1 | 11/2013 |

OTHER PUBLICATIONS

R. Micheloni, L.Crippa, A, Marelli, "InsideNANDFlashMemories" Springer Science +Business Media B.V. 2010 ISBN 978-90-481-9430-8, pp. 515-536, formatted as 12 sheets.
Chanik Park, Prakash Talawar, Daesik Won, MyungJin Jung, JungBeen Im, Suksan Kim and Youngjoon Choi, "A High Performance Controller for NAND Flash-based Solid State Disk (NSSD)," in Non-volatile Semiconductor Memory Workshop (NVSMW) Digest Technical Papers, 2006, pp. 17-20 (4 sheets).
K. Takeuchi, "NAND Successful as a Media for SSD" IEEE International Solid-State Circuits Conference Tutorial T7, 2008, rotated, pp. 1-81 (81 sheets).
International Search Report in related case PCT/US2013/039138, 10 pages.
International Search Report and Written Opinion in the parent PCT/US2011/028244, 12 pages.
J. S. Plank and M. G. Thomason. "On the Practical Use of LDPC Erasure Codes for Distributed Storage Applications", Technical Report CS-03-510, University of Tennessee, Sep. 2003, 15 pages.
International Search Report and the Written Opinion in the related PCT/US12/21682, 9 pages.
Devang Panchigar "EMC Symmetrix DMX—Raid 6 Implementation" Feb. 27, 2009, http://storagenerve.com/2009/02/27/emc-symmetrix-dmx-raid-6-implementation/, 9 pages.
H. Peter Anvin, "The mathematics of RAID-6" Last updated Dec. 20, 2011, https://www.kernel.org/pub/linux/kernel/people/hpa/raid6.pdf, accessed on Sep. 30, 2013, 9 pages.
Advanced Computer & Network Corporation, "RAID Level 6: Independent Data Disks with Two Independent Parity Schemes", http://www.acnc.com/raidedu/6, accessed on Sep. 30, 2013, 2 pages.
S. Li, T. Zhang, "Improving Multi-Level NAND Flash Memory Storage Reliability Using Concatenated BCH-TCM Coding" in IEEE Transactions on Very Large Scale Integration (VLSI) Systems, vol. 18, No. 10, Oct. 2010, pp. 1412-1420 (9 sheets).
International Search Report in related PCT/US2011/062726, 3 pages.
The Written Opinion in related PCT/US2011/062726, 3 pages.
International Search Report and the Written Opinion in related PCT/US2011/057914, 9 pages.
Unpublished document authored by co-inventor Danilak, accompanying his Jan. 18, 2013 declaration of inventorship; (1 sheet).
Skyera Inc., "Management << Skyera", Skyera company management web-page partial listing including co-inventor Danilak as CEO, retrieved from http://www.skyera.com/company/management/, Oct. 4, 2013 (1 sheet).

* cited by examiner

LDPC ERASURE DECODING FOR FLASH MEMORIES

CROSS REFERENCE TO RELATED APPLICATIONS

This application is a 371 of PCT/US2011/028244 Mar. 11, 2011 which claims benefit of U.S. Provisional No. 61/313,681 Mar. 12, 2010.

INCORPORATION BY REFERENCE

Priority benefit claims for this application are made in the accompanying Application Data Sheet, Request, or Transmittal (as appropriate, if any). To the extent permitted by the type of the instant application, this application incorporates by reference for all purposes the following applications, all owned by the owner of the instant application:

U.S. Provisional Application (Ser. No. 61/313,681), filed 12 Mar. 2010, first named inventor Hao Zhong, and entitled LDPC Erasure Decoding for Flash Memories.

BACKGROUND

1. Field

Advancements in accessing of flash memory are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

BRIEF SUMMARY OF THE INVENTION

The invention may be implemented in numerous ways, including as a process, an article of manufacture, an apparatus, a system, a composition of matter, and a computer readable medium such as a computer readable storage medium (e.g. media in an optical and/or magnetic mass storage device such as a disk, or an integrated circuit having non-volatile storage such as flash storage) or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

In various embodiments, a Solid-State Disk (SSD) controller uses Low Density Parity Check (LDPC) decoding to enable flash memory accesses with improved latency and/or error correction capabilities. With Single-Level Cell (SLC) flash memory having a Bit Error Rate (BER) less than a predetermined value, the SSD controller uses a 1-bit read (single read) hard-decision LDPC decoder to access the flash memory. If the hard-decision LDPC decoder detects an uncorrectable error, then the SSD controller uses a 1.5-bit read (two reads) erasure-decision LDPC decoder to access the flash memory. With flash memory having a raw BER between two other predetermined values, the SSD controller omits the use of the hard-decision LDPC decoder and uses only the erasure-decision LDPC decoder to access the flash memory. Variations of the SSD controller similarly access Multi-Level Cell (MLC) flash memory. Some SSD controllers dynamically switch between hard-decision and erasure-based decoders based on dynamic decoder selection criteria. In various embodiments, one or more initial reads are requested at a particular location in a flash memory, in response to receiving a request for data stored at the particular location. In response to completing the initial reads, an uncorrectable error is detected via a hard-decision based LDPC decoding based on results of the initial reads. In response to the detecting, one or more additional reads are requested at the particular location. In response to completing the additional reads, an erasure-decision LDPC decoding is performed based on respective results of the additional reads.

BRIEF DESCRIPTION OF DRAWINGS

FIGS. 2A-2C show i) distribution of threshold voltages across all cells corresponding to the various logic states written in the cells, and ii) sense voltage levels (represented by dashed lines) used according to embodiment to retrieve raw data stored in the cells.

FIGS. 5A and 5B show i) distribution of threshold voltages across all cells corresponding to the various logic states written in the cells, and ii) sense voltage levels (represented by dashed lines) used according to embodiment to retrieve raw data stored in the cells.

DETAILED DESCRIPTION

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

Elsewhere herein various shorthand abbreviations, or acronyms, refer to certain elements. The descriptions of at least some of the acronyms follow.

| Acronym | Description |
|---|---|
| BCH | Bose Chaudhuri Hocquenghem |
| BER | Bit Error Rate |
| CD | Compact Disk |
| CF | Compact Flash |
| CMOS | Complementary Metal Oxide Semiconductor |
| CPU | Central Processing Unit |
| CRC | Cyclic Redundancy Check |
| DDR | Double-Data-Rate |
| DMA | Direct Memory Access |
| DVD | Digital Versatile/Video Disk |
| ECC | Error-Correcting Code |
| HDD | Hard Disk Drive |
| LBA | Logical Block Address |
| LDPC | Low-Density Parity-Check |
| MLC | Multi-Level Cell |
| MMC | MultiMediaCard |
| NCQ | Native Command Queuing |
| ONFI | Open NAND Flash Interface |
| PC | Personal Computer |
| PCIe | Peripheral Component Interconnect express (PCI express) |

-continued

| Acronym | Description |
|---|---|
| PDA | Personal Digital Assistant |
| RAID | Redundant Array of Inexpensive/Independent Disks |
| RS | Reed-Solomon |
| SAS | Serial Attached Small Computer System Interface (Serial SCSI) |
| SATA | Serial Advanced Technology Attachment (Serial ATA) |
| SD | Secure Digital |
| SLC | Single-Level Cell |
| SMART | Self-Monitoring Analysis and Reporting Technology |
| SSD | Solid-State Disk/Drive |
| USB | Universal Serial Bus |

Some types of NAND flash memory use an array of floating gate transistors to store information. Each bit cell (e.g. floating gate transistor) is enabled to store a single bit of information, known as SLC, or alternatively multiple bits of information, known as MLC. Downward scaling of CMOS technology reduces how many electrons are stored in the floating gates. Increasing storage capacity and/or density increases how many bits are stored per cell. Therefore, relatively smaller voltage ranges represent values stored in cells as technology scales down. Uncertainties in sensing and/or changes over time in how many stored electrons there are increase data read errors. In some implementations and/or usage scenarios, an ECC enables correct retrieval of otherwise corrupted data.

Some types of SSDs use flash memory to provide non-volatile storage (e.g., information is retained without application of power). Some SSDs are compatible with form-factors, electrical interfaces, and/or protocols used by magnetic and/or optical non-volatile storage, such as HDDs, CD drives, and DVD drives. Some SSDs use RS and/or BCH codes for error correction.

A Solid-State Disk (SSD) controller uses Low Density Parity Check (LDPC) decoding to enable flash memory accesses with improved latency and/or error correction capabilities. In some embodiments, if Single-Level Cell (SLC) technology flash memory has a raw Bit Error Rate (BER) less than a predetermined value, then the SSD controller uses a 1-bit read (single read) hard-decision LDPC decoder to access the flash memory. If the hard-decision LDPC decoder detects an uncorrectable error, then the SSD controller uses a 1.5-bit read (two reads) erasure-decision LDPC decoder to access the flash memory. In some embodiments, if the flash memory has a raw BER between two other predetermined values, then the SSD controller omits the use of the hard-decision LDPC decoder and uses only the erasure-decision LDPC decoder to access the flash memory. Variations of the SSD controller use similar techniques to access Multi-Level Cell (MLC) technology flash memory. Some SSD controllers dynamically switch between hard-decision and erasure-based decoders based on dynamic decoder selection criteria. The criteria include number of program/erase cycles, read disturb event count(s), write disturb event count(s), previous correctable error counts, and/or previous uncorrectable error counts.

System

Figure 1A:
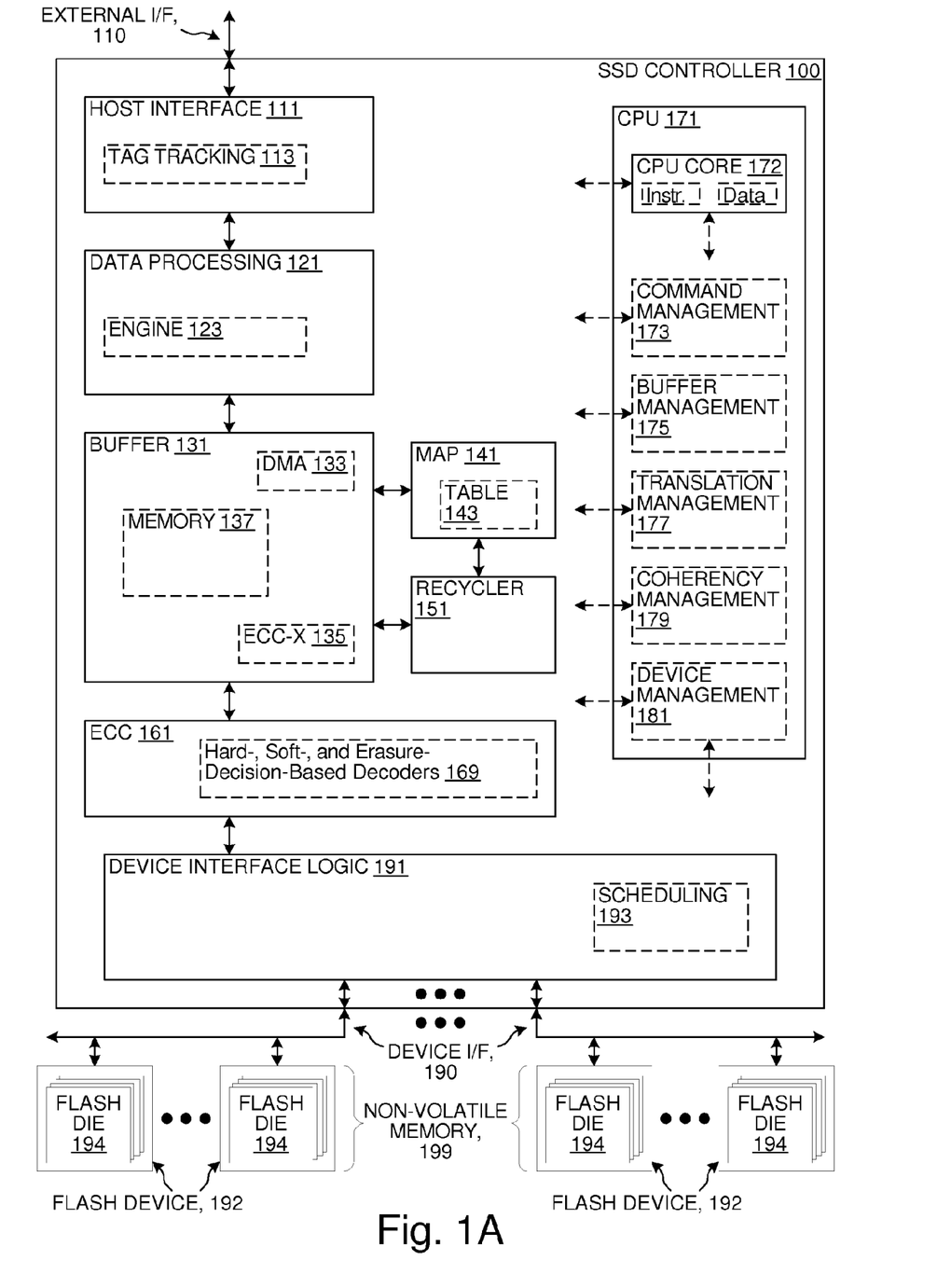
FIG. 1A illustrates selected details of an embodiment of a Solid-State Disk (SSD) including an SSD controller using Low Density Parity Check (LDPC) code based flash memory access.

FIG. 1A illustrates selected details of an embodiment of a Solid-State Disk (SSD) including an SSD controller using Low Density Parity Check (LDPC) code based flash memory access. SSD controller 100 is communicatively coupled via one or more external interfaces 110 to a host (not illustrated). According to various embodiments, external interfaces 110 are one or more of: a SATA interface; a SAS interface; a PCIe interface; a Fiber Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD controller 100 includes a SATA interface and a PCIe interface.

SSD controller 100 is further communicatively coupled via one or more device interfaces 190 to non-volatile memory 199 including one or more storage devices, such as flash devices 192. According to various embodiments, device interfaces 190 are one or more of: an asynchronous interface; a synchronous interface; a DDR synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Flash devices 192 have, in some embodiments, one or more individual flash die 194. According to type of a particular one of flash devices 192, a plurality of flash die 194 in the particular flash device 192 are optionally and/or selectively accessible in parallel. Flash devices 192 are merely representative of one type of storage device enabled to communicatively couple to SSD controller 100. In various embodiments, any type of storage device is usable, such as an SLC NAND flash memory, MLC NAND flash memory, NOR flash memory, read-only memory, static random access memory, dynamic random access memory, ferromagnetic memory, phase-change memory, racetrack memory, or any other type of memory device or storage medium.

According to various embodiments, device interfaces 190 are organized as: one or more busses with one or more flash devices 192 per bus; one or more groups of busses with one or more flash devices 192 per bus, where busses in a group are generally accessed in parallel; or any other organization of flash devices 192 onto device interfaces 190.

Continuing in FIG. 1A, SSD controller 100 has one or more modules, such as host interface 111, data processing 121, buffer 131, map 141, recycler 151, ECC 161, device interface logic 191, and CPU 171. The specific modules and interconnections illustrated in FIG. 1A are merely representative of one embodiment, and many arrangements and interconnections of some or all of the modules, as well as additional modules not illustrated, are conceived. In a first example, in some embodiments, there are two or more host interfaces 111 to provide dual-porting. In a second example, in some embodiments, data processing 121 and/or ECC 161 are combined with buffer 131. In a third example, in some embodiments, host interfaces 111 is directly coupled to buffer 131, and data processing 121 optionally and/or selectively operates on data stored in buffer 131. In a fourth example, in some embodiments, device interface logic 191 is directly coupled to buffer 131, and ECC 161 optionally and/or selectively operates on data stored in buffer 131.

Host interface 111 sends and receives commands and/or data via external interface 110, and, in some embodiments, tracks progress of individual commands via tag tracking 113. For example, in some embodiments, host interface 111 is compatible with the SATA protocol and, using NCQ commands, is enabled to have up to 32 pending commands, each with a unique tag represented as a number from 0 to 31. In some embodiments, tag tracking 113 is enabled to associate an external tag for a command received via external interface 110 with an internal tag used to track the command during processing by SSD controller 100.

According to various embodiments, one or more of: data processing 121 optionally and/or selectively processes some or all data sent between buffer 131 and external interfaces 110; and data processing 121 optionally and/or selectively processes data stored in buffer 131. In some embodiments, data processing 121 uses one or more engines 123 to perform one or more of: encrypting; decrypting; compressing; decompressing; formatting; reformatting; transcoding; and any other data processing and/or manipulation task.

Buffer 131 stores data sent to/from external interfaces 110 from/to device interfaces 190. In some embodiments, buffer 131 additionally stores system data, such as some or all map tables, used by SSD controller 100 to manage flash devices 192. In various embodiments, buffer 131 has one or more of: memory 137 used for temporary storage of data; DMA 133 used to control movement of data to and/or from buffer 131; ECC-X 135 used to provide a higher-level error correction function, such as RAID performed across multiple ones of flash devices 192 and/or flash die 194; and other data movement and/or manipulation functions.

According to various embodiments, one or more of: ECC 161 optionally and/or selectively processes some or all data sent between buffer 131 and device interfaces 190; and ECC 161 optionally and/or selectively processes data stored in buffer 131. In some embodiments, ECC 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC 161 includes one or more decoders (such as LDPC decoders), as illustrated conceptually by Hard-, Soft-, and Erasure-Decision-Based Decoders 169.

Device interface logic 191 controls flash devices 192 via device interfaces 190. Device interface logic 191 is enabled to send data to/from flash devices 192 according to a protocol of flash devices 192. Device interface logic 191 includes scheduling 193 to selectively sequence control of flash devices 192 via device interfaces 190. For example, in some embodiments, scheduling 193 is enabled to queue operations to flash devices 192, and to selectively send the operations to individual ones of flash devices 192 (or flash die 194) as individual flash devices 192 (or flash die 194) are available.

Map 141 is enabled to convert between data addressing used on external interfaces 110 and data addressing used on device interfaces 190. For example, in some embodiments, LBAs used on external interfaces 110 are converted by map 141 to block and/or page addresses targeting one or more flash die 194. In some embodiments, a granularity of map 141 is fixed, such as mapping first fixed-sized logical blocks used on external interfaces 110 to second fixed-sized blocks used on device interfaces 190. In other embodiments, a granularity of map 141 is variable and not all blocks used on either external interfaces 110 or device interfaces 190 are necessarily a same size.

In some embodiments, map 141 uses table 143 to perform and/or to look up translations between addresses used on external interfaces 110 and data addressing used on device interfaces 190. According to various embodiments, table 143 is one or more of: a one-level map; a two-level map; a multi-level map; a map cache; a compressed map; any type of mapping from one address space to another; and any combination of the foregoing. According to various embodiments, table 143 includes one or more of: static random access memory; dynamic random access memory; non-volatile memory (such as flash memory); cache memory; on-chip memory; off-chip memory; and any combination of the foregoing.

In some embodiments, recycler 151 performs garbage collection. For example, in some embodiments, flash devices 192 contain blocks that must be erased before the blocks are re-writeable. Recycler 151 is enabled to determine which portions of flash devices 192 are actively in use, such as by scanning a map maintained by map 141, and to make unused portions of flash devices 192 available for writing by erasing them. In further embodiments, recycler 151 is enabled to move data stored within flash devices 192 to make larger contiguous portions of flash devices 192 available for writing.

CPU 171 controls various portions of SSD controller 100. CPU 171 includes CPU core 172. CPU core 172 is, according to various embodiments, one or more single-core or multi-core processors. The individual processors cores in CPU core 172 are, in some embodiments, multi-threaded. CPU core 172 includes instruction and/or data caches and/or memories. For example, the instruction memory contains instructions to enable CPU core 172 to execute software (sometimes called firmware) to control SSD controller 100. In some embodiments, some or all of the firmware executed by CPU core 172 is stored on flash devices 192.

In various embodiments, CPU 171 further includes: command management 173 to track and control commands received via external interfaces 110 while the commands are in progress; buffer management 175 to control allocation and use of buffer 131; translation management 177 to control map 141; coherency management 179 to control consistency of data addressing and to avoid conflicts such as between external data accesses and recycle data accesses; device management 181 to control device interface logic 191; and optionally other management units. None, any, or all of the management functions performed by CPU 171 are, according to various embodiments, controlled and/or managed by hardware, by software (such as software executing on CPU core 172 or on a host connected via external interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments comprise a computing-host flash memory controller that is similar to SSD controller 100 and is compatible with operation with various computing hosts, such as via adaptation of host interface 111 and/or external interface 110. The various computing hosts include one or any combination of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game.

Figure 1B:
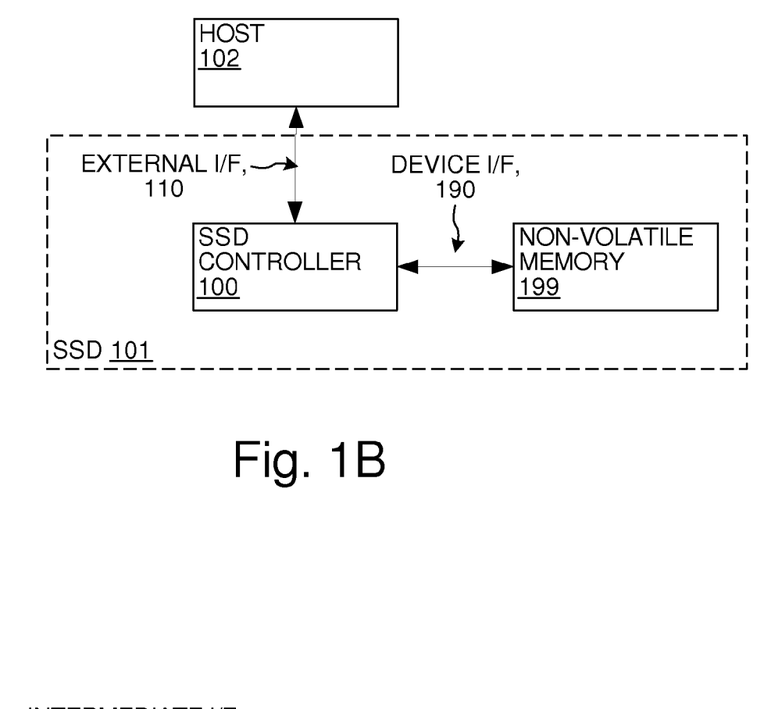
FIG. 1B illustrates selected details of an embodiment of a system including the SSD of FIG. 1A.

FIG. 1B illustrates selected details of an embodiment of a system including the SSD of FIG. 1A. SSD 101 includes SSD controller 100 coupled to non-volatile memory 199 via device interfaces 190. The SSD is coupled to host 102 via external interfaces 110.

Figure 1C:
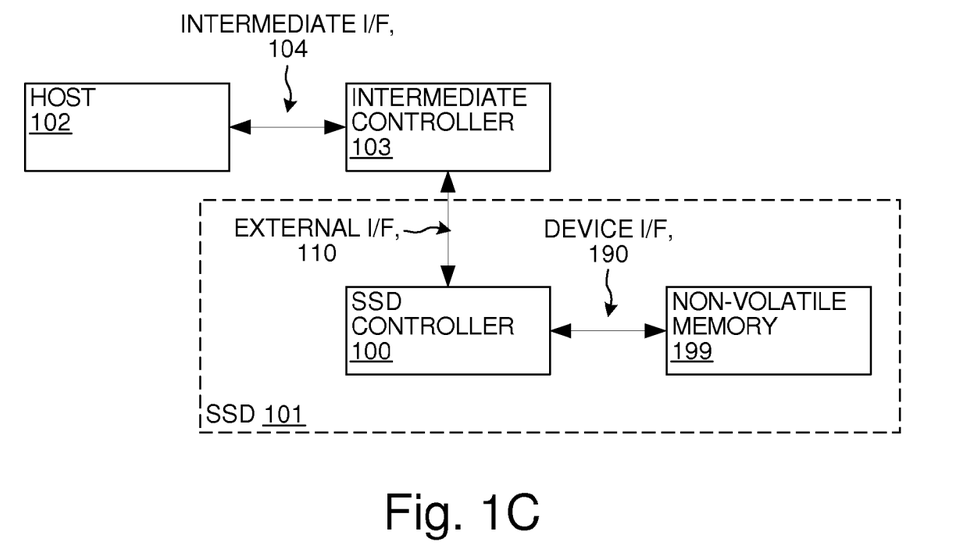
FIG. 1C illustrates selected details of an embodiment of a system including the SSD of FIG. 1A.

FIG. 1C illustrates selected details of an embodiment of a system including the SSD of FIG. 1A. As in FIG. 1B, SSD 101 includes SSD controller 100 coupled to non-volatile memory 199 via device interfaces 190. The SSD is coupled to host 102 via external interfaces 110 in turn coupled to intermediate controller 103 and then to host 102 via intermediate interfaces 104. In various embodiments, SSD controller 100 is coupled to the host via one or more intermediate levels of other controllers, such as a RAID controller.

In various embodiments, an SSD controller and/or a computing-host controller in combination with one or more non-volatile memories are implemented as a non-volatile storage component, such as a USB storage component, a CF storage component, an MMC storage component, an SD storage component, a Memory Stick storage component, and an xD storage component.

At a command management 173 level of abstraction, a "read" command initiates one or more read processes to retrieve information from non-volatile memory 199. In the lower-level context of SLC and MLC, the term "read" refers to a cell-level read having a single read voltage. In some embodiments, a flash memory performs multiple cell-level reads at different read voltages (all at the same specified read address) without any explicit control external to the flash memory, e.g. the reads at different voltages are "hidden" within the flash memory. In other embodiments, a control agent external to the flash memory (and operating at a device management 181 level) explicitly directs multiple cell-level reads at different read voltages to occur. In various embodiments, the multiple cell-level reads are additional and/or optional reads to obtain soft-decision and/or erasure-decision information for SLC and/or MLC cells, are to obtain hard-decision information for an MLC cell (e.g. three reads for a 2-bit per cell MLC), or any combination thereof.

Unless explicitly qualified, references to controlling, setting, or adjusting the "read voltage" refer broadly to direct or indirect controlling or setting of a read voltage, such as via one or more voltage specifiers that represent one or more actual read voltage levels or selection of a sequence of a plurality of actual read voltage levels. In various embodiments, a control agent providing the voltage specifier(s) has knowledge of actual read voltage levels, while in various other embodiments, the control agent has no knowledge of the actual read voltage levels. The terms "read voltage" and "sense voltage" are used interchangeably.

SLC Operation

Figure 2A:
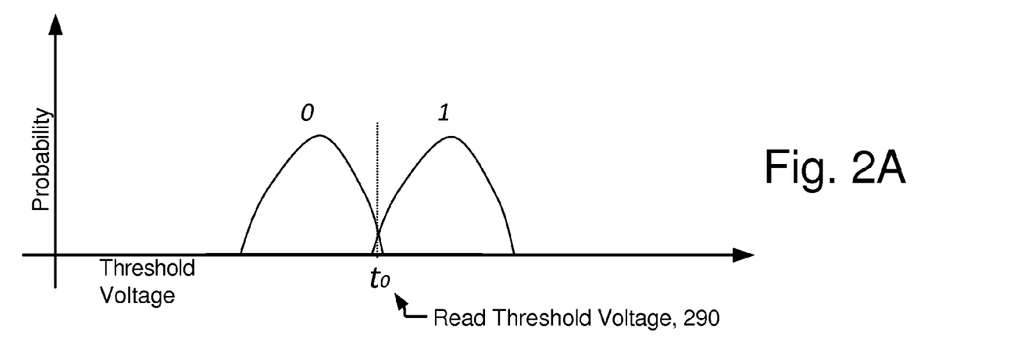
FIG. 2A illustrates selected details of an embodiment of obtaining hard-decision information via one read of a Single-Level Cell (SLC)
Figure 2B:
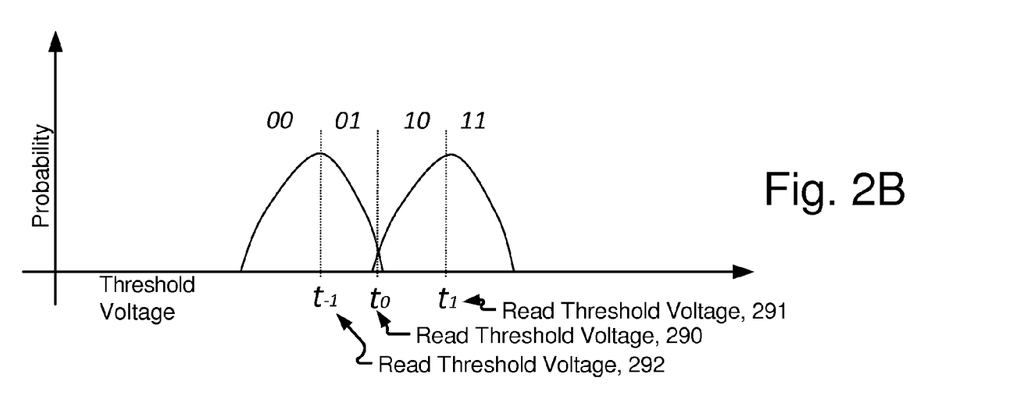
FIG. 2B illustrates selected details of an embodiment of obtaining soft-decision information via three reads of an SLC.

Unlike some character-based RS or BCH decoders that use only hard-decision information (e.g. one bit per stored bit) from flash memory as input, some LDPC decoder are enabled to use soft information to enable improved error correction. Thus, the soft-decision information (e.g. more than one bit per stored bit) is read from a flash memory to increase error correction capability. SLC is used as an example to demonstrate how to obtain hard-decision or soft-decision information from the flash memory. The techniques apply to MLC similarly. To obtain hard-decision information from the flash memory, only one read with programmed voltage $t_0$ is performed, as illustrated in FIG. 2A (Read Threshold Voltage 290). To obtain two bits of soft-decision information from the flash memory, three reads with three different voltages ($t_{-1}$, $t_0$, and $t_1$) are performed, as illustrated in FIG. 2B (Read Threshold Voltage 292, Read Threshold Voltage 290, and Read Threshold Voltage 291, respectively). The flash memory provides a capability to set a voltage for a read. Multiple reads, each with a respective voltage, are used to obtain the soft-decision information.

In some embodiments and/or usage scenarios, reading soft-decision information increases access time of a flash memory (such as by a factor of three as described with respect to FIG. 2A and FIG. 2B). Techniques, as described herein, enable, in some embodiments and/or usage scenarios, improvements in one or more of efficiency of access, power, and latency.

Figure 2C:
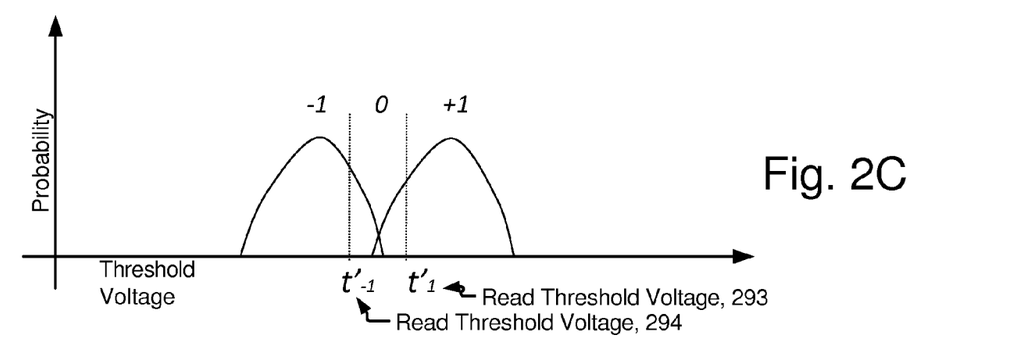
FIG. 2C illustrates selected details of an embodiment of obtaining erasure-decision information via two reads of an SLC.

In some embodiments and/or usage scenarios, an erasure-based LDPC decoder outperforms a hard-decision decoder when the erasure-based LDPC decoder is provided with hard-decision information and erasure information (e.g., when a bit is undetermined due to high uncertainty). Two reads with voltages $t'_{-1}$ and $t'_{1}$ (as in FIG. 2C, e.g. Read Threshold Voltage 294 and Read Threshold Voltage 293, respectively) are performed to provide an equivalent of 1.5 bits of information per stored bit. In FIG. 2C, the two voltages (represented by respective dashed lines) used for the reads conceptually represent three ranges. The outer ranges respectively correspond to a first logic state and a second logic state (such as zero and one, respectively, or vice versa, the particular assignment being established by system design constraints or design choice). The inner range corresponds to an "erasure" (an error coding concept, here signifying that data values in this range are presumed to be incorrect). In some embodiments and/or usage scenarios, error correction performance of the erasure-based LDPC is comparable or better than a 2-bit soft-decision LDPC based on three reads (as in FIG. 2B). In some circumstances, access speed and power consumption are improved by one-third, and latency is reduced by one-third, for example because the erasure-based LDPC decoding is based on two reads versus three reads for the 2-bit soft-decision LDPC decoding.

In various embodiments, a hard-decision LDPC decoder (such as all or any portion of Hard-, Soft-, and Erasure-Decision-Based Decoders 169 of FIG. 1A) processes hard-decision information (such as associated with FIG. 2A). In various embodiments, a soft-decision LDPC decoder (such as all or any portion of Hard-, Soft-, and Erasure-Decision-Based Decoders 169 of FIG. 1A) processes soft-decision information (such as associated with FIG. 2B). In various embodiments, an erasure-decision LDPC decoder (such as all or any portion of Hard-, Soft-, and Erasure-Decision-Based Decoders 169 of FIG. 1A) processes erasure-decision information (such as associated with FIG. 2C).

Figure 3:
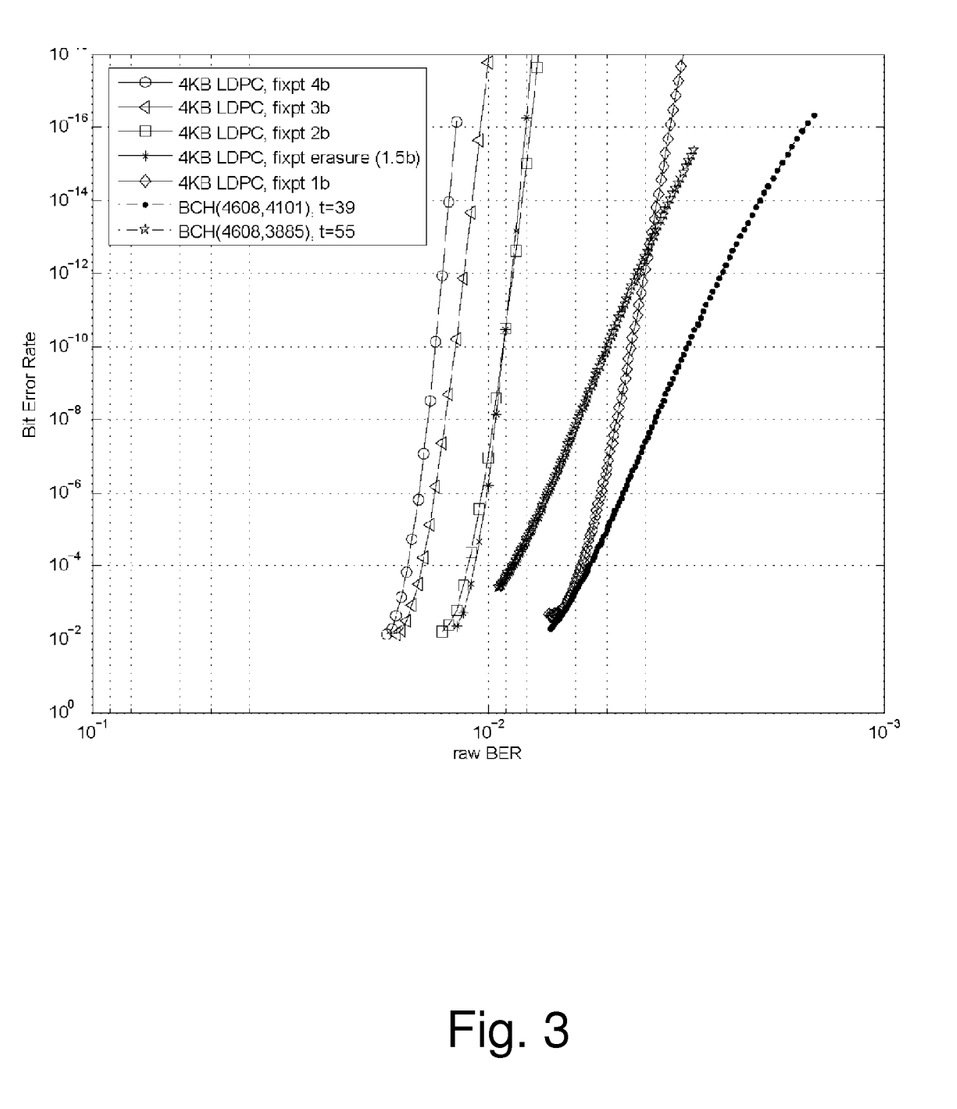
FIG. 3 illustrates error correction performance of various techniques, such as various rate 8/9 codes.

FIG. 3 illustrates error correction performance of various techniques, such as various rate 8/9 codes. In the legend of the figure, 'fixpt' means "fixed point". The legend '4 KB LDPC, fixpt 1b' corresponds to a single read technique (such as illustrated by FIG. 2A). The legend '4 KB LDPC, fixpt erasure 1.5b' corresponds to a two read technique (such as illustrated by FIG. 2C). The legend '4 KB LDPC, fixpt 2b' corresponds to a three read technique (such as illustrated by FIG. 2B). The legends '4 KB LDPC, fixpt 3b' and '4 KB LDPC, fixpt 4b' correspond, respectively to seven and 15 read techniques.

Figure 4A:
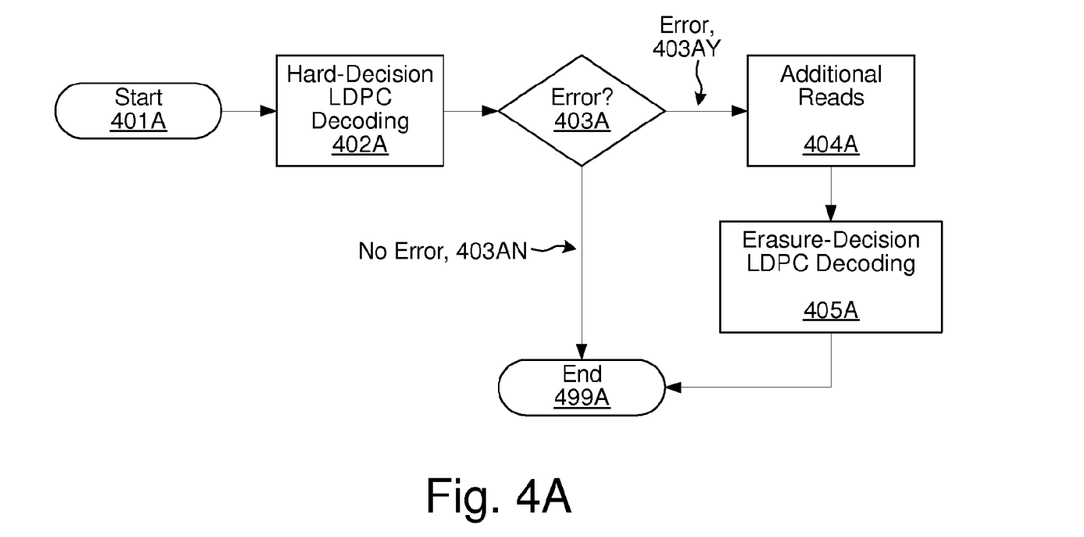
FIGS. 4A, 4B, and 4C illustrate selected details of operations of embodiments of SSDs based on LDPC decoding.
Figure 4B:
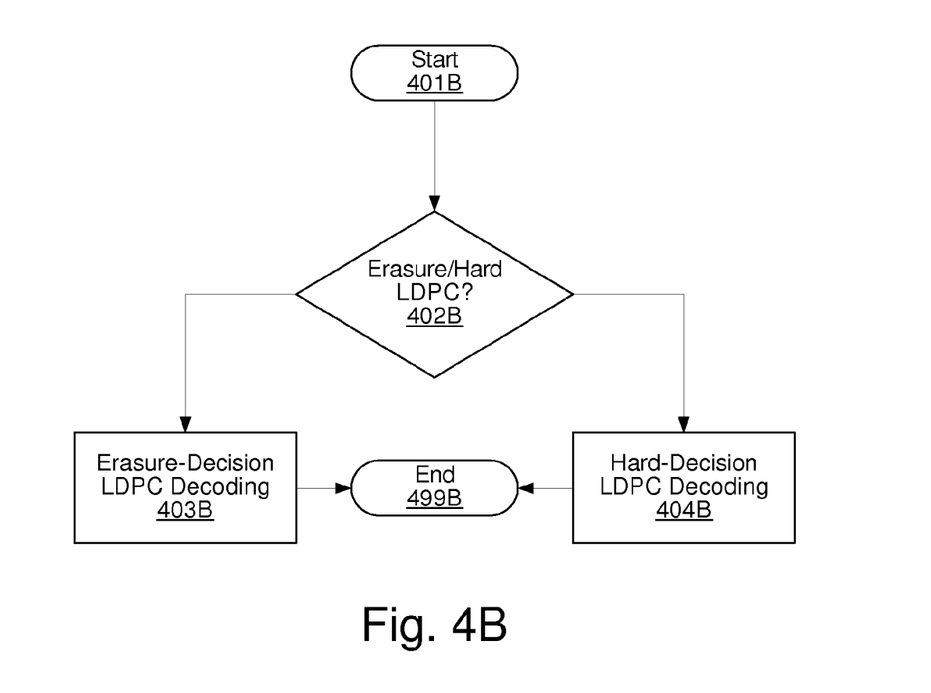
Figure 4C:
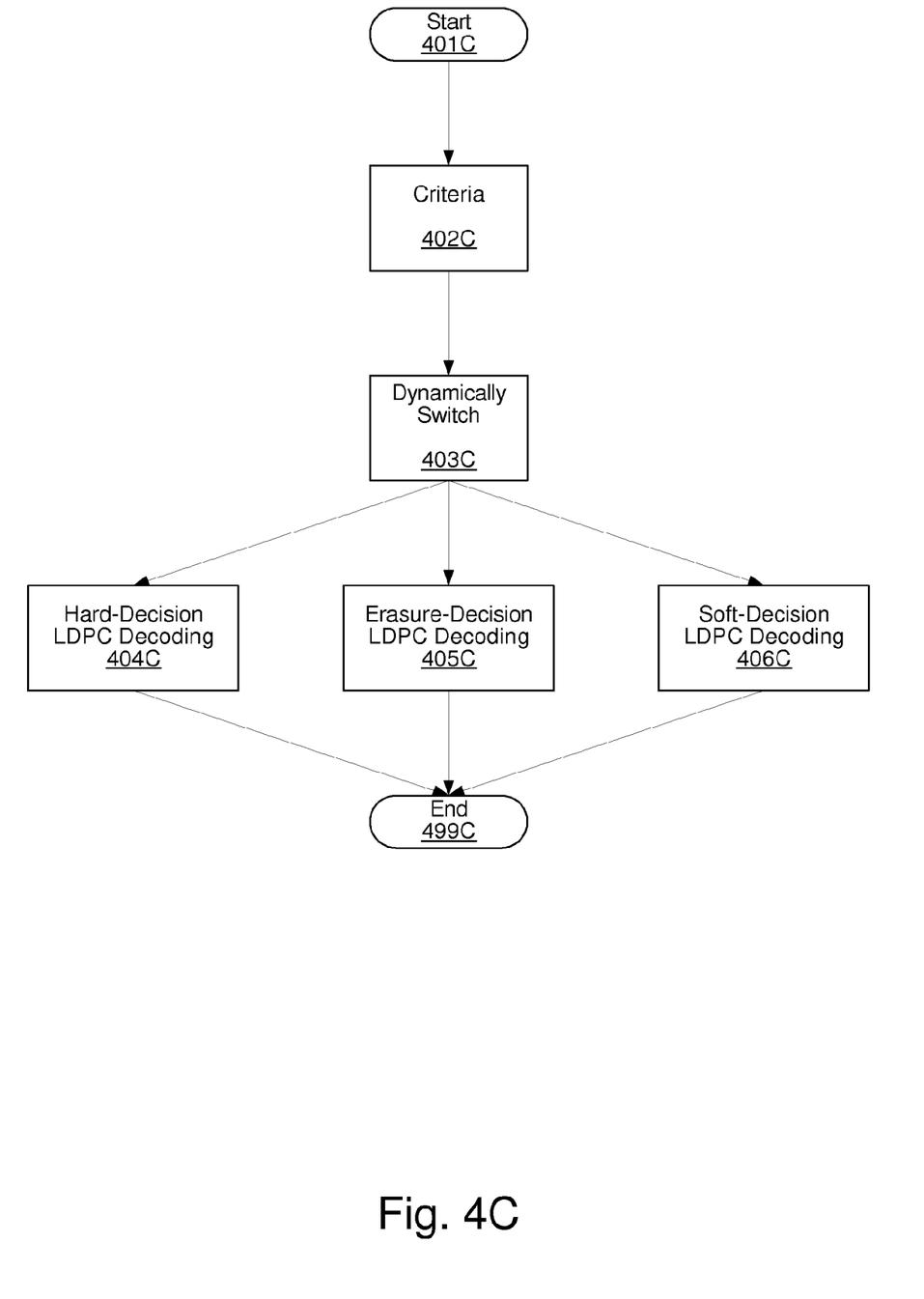

Some embodiments, with an SSD having an LDPC decoder (e.g. based on the 4 KB LDPC codes illustrated in FIG. 3), operate as follows:

1. As illustrated in FIG. 4A, for flash devices with a raw BER lower than a predetermined level (such as $3 \times 10^{-3}$):
   a. The SSD starts with a hard-decision LDPC decoding (Hard-Decision LDPC Decoding 402A) using a 1-bit read (one read as in FIG. 2A).
   b. If there is an uncorrectable error (Error? 403A) from the hard-decision LDPC decoding (Error 403AY), then the SSD performs an (erasure-decision) LDPC decoding using soft-decision information bits via two additional reads (Additional Reads 404A and Erasure-Decision LDPC Decoding 405A), providing an equivalent of 1.5 bits per stored bit (as in FIG. 2C).
   c. If uncorrectable errors are relatively infrequent, then average speed is relatively close to the hard-decision decoder.
2. As illustrated in FIG. 4B, in some circumstances (for instance as technology scales down and density increases) a flash device raw BER is higher than a predetermined level (such as $7 \times 10^{-3}$) and is lower than another predetermined level (such as $4 \times 10^{-3}$):
   a. The SSD starts with an erasure-based LDPC decoding using 1.5 bit reads (two reads as in FIG. 2C). Thus in some situations, the erasure-based LDPC decoding performance is faster than a 2-bit input soft decoder (two reads as in FIG. 2C versus three reads as in FIG. 2B), while error correction capability is comparable or better. A decision (e.g. Erasure/Hard LDPC? 402B) of whether to use hard-decision LDPC decoding (e.g. Hard-Decision LDPC Decoding 404B) or erasure-based LDPC decoding (e.g. Erasure-Decision LDPC Decoding 403B) is, for example, based on flash memory type installed in the SSD (e.g. SLC versus MLC), environmental conditions, speed of operation, and/or other factors.
3. As illustrated in FIG. 4C, dynamic switching of decoder types (e.g. Dynamically Switch 403C), such as between hard-decision (e.g. Hard-Decision LDPC Decoding 404C), erasure-based (e.g. Erasure-Decision LDPC Decoding 405C), and soft-decision (e.g. Soft-Decision LDPC Decoding 406C), is performed according to various criteria (Criteria 402C), according to various embodiments. The criteria include number of program/erase cycles, read disturb (number of reads of the same and/or adjacent pages/blocks), write disturb, previous error-free read rates and/or counts, previous correctable error rates and/or counts, previous uncorrectable error rates and/or counts, and/or other factors. Rates and/or counts are further distinguished, in some embodiments, as occurring in various contexts of hard-, soft-, or erasure-based decoding. Counts are defined, in some embodiments, with respect to specific intervals, such as: from device manufacture, from last device power-on, or from any other pre-defined event. On a block-by-block basis, a decision is made, based on history associated with the block being read, as to whether pages in the block are read once (as in FIG. 2A) with hard-decision LDPC decoding, or read twice (as in FIG. 2C) with erasure-based LDPC decoding. In various embodiments, the decision and the history are on a page basis, or on any other basis, the decision is made at any time, the decision switches back and forth between hard-decision-based and erasure-based, and other variations.

In some embodiments, when a hard-decision LDPC is used and an uncorrectable error is detected, the page (or block or whatever unit is being used) is re-read one or more times and correction attempted with another technique (such as erasure-based LDPC as in FIG. 2C).

In some embodiments, hard-decision decoding is performed as in FIG. 2A. In some other embodiments, the $t_0$ voltage of FIG. 2A is adjusted to the right or to the left to be closer to one or the other of $t'_{-1}$ or $t'_{1}$ of FIG. 2C. The adjustment trades off some increase in hard-decision error rate (by biasing the '1' vs. '0' decision) against saving a second read to obtain erasure information, and/or performing one additional read to use an erasure-based code, optionally with some bias to determine which bits are erased. A decision as to whether to adjust the voltage, and/or adjustment amount, is performed dynamically, in some embodiments, as described above. Further, a bias direction of the first read and/or a bias magnitude are determined according to one or more of several criteria, according to various embodiments. The criteria include predominance of 1's or 0's in data, and knowledge of particular device type and whether the particular device type is more likely to gain or to lose charge in cells. The criteria further include knowledge of previous history of a specific device and/or specific block/page being read, such as types of previous operations (since in some circumstances read disturb tends to drift cells in a particular direction, whereas nearby writes tend to do the opposite), previous error history (whether errors were 1->0 or 0->1), and other factors.

In some embodiments, results of a first read (as in FIG. 2A), performed to acquire hard-decision information, is used as an input to control voltages for a second read to produce information (as in FIG. 2C) with one additional read. Results of the first read are saved in the device, such as in a page buffer, or alternatively returned to the device if the second read is performed. In some embodiments, the voltage for the second read is settable (per cell) to be $t'_1$ if the previous read returned a '1', or to be $t'_{-1}$ if the previous read returned a '0'. One additional read is performed to determine an extra 0.5 bits of information. For example, if a first read returns a '1' for a given cell, then it is only necessary to disambiguate '1' vs. 'e' since the cell is not a '0'.

In some embodiments, counting a number of 0's vs. a number of 1's returned in the first read provides a bias used to determine which way charge in the cells in the particular page (for example) have drifted, and if the number of 0's vs. 1's is outside of an expected range, then read voltages for performing the additional reads are adjusted accordingly. For example, in an embodiment where all data written to flash memory is encrypted, given a large page size, the balance of 0's and 1's is close to 50-50. A deviation outside an expected range indicates a charge drift on a particular page that some embodiments compensate for by adjusting the read voltages in FIG. 2C. Some flash devices have multiple reasons for charge drift, and it is not known a priori whether a given page has drifted towards more 0's or more 1's. In some embodiments, data stored in the flash memory is encrypted or otherwise scrambled, and is effectively randomized with a nominal 50-50 balance of 0's and 1's (with some statistical variation), or with some other known balance of 0's and 1's.

In some embodiments, if erasure-based decoding fails, then further soft-decision decoding is performed. For example, additional reads are used to determine 4-bit soft-decision information, and a 4-bit, fixed-point soft-decision LDPC decoder is used.

MLC Operation

Figure 5A:
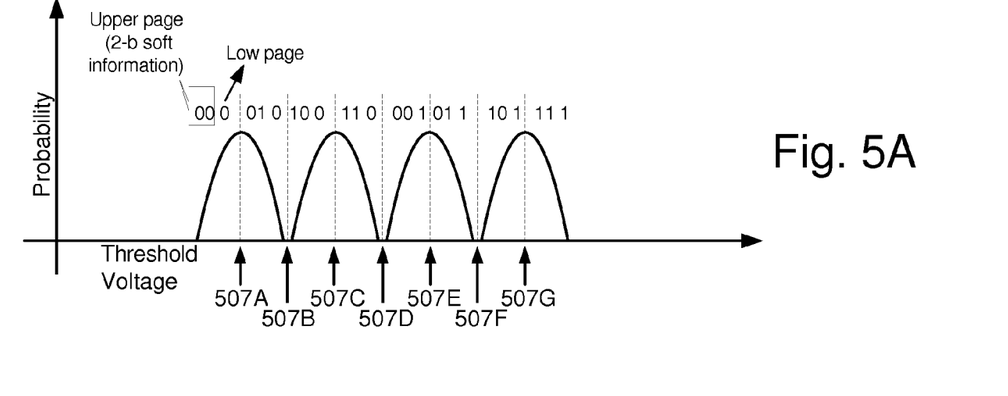
FIG. 5A illustrates selected details of an embodiment of obtaining information via seven reads of a 2-bit per cell Multi-Level Cell (MLC)
Figure 5B:
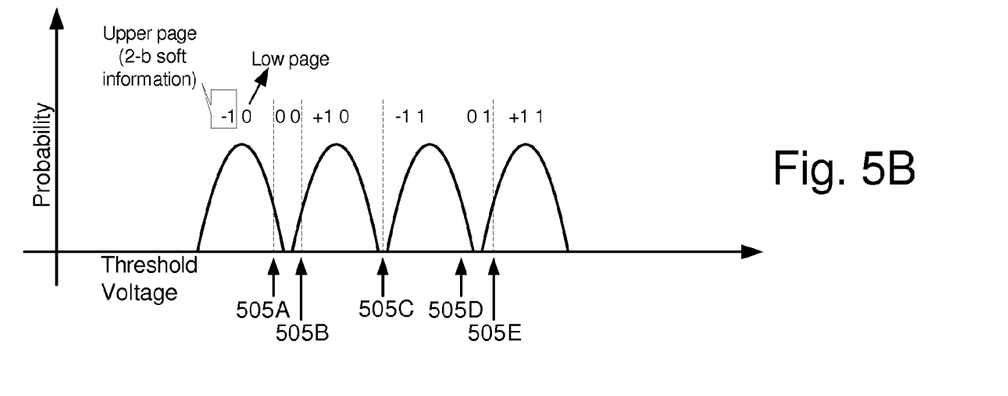
FIG. 5B illustrates selected details of an embodiment of obtaining erasure-decision information via five reads of a 2-bit per cell MLC.

FIG. 5A illustrates selected details of an embodiment of obtaining information via seven reads (reads 507A-507G) of a 2-bit per cell MLC, and FIG. 5B illustrates selected details of an embodiment of obtaining erasure-decision information via five reads (reads 505A-505E) of a 2-bit per cell MLC. In some embodiments using 2-bit per cell MLC technology, there are "lower" pages (left half or right half) and "upper" pages (left quarter vs. right quarter in each half). Obtaining information from a lower half page is performed as described for SLC (see the "SLC Operation" section elsewhere herein). Obtaining information from an upper page uses additional reads (such as illustrated by FIGS. 5A and 5B).

In some embodiments, obtaining hard-decision information from an upper page uses three reads, a first read to determine which half of the page, a second read to determine which quarter in the upper half (left quarter vs. right quarter), and a third read to determine which quarter in the lower half (left quarter vs. right quarter). In some MLC embodiments, all cells have a common read voltage, and because some lower page cells are storing zeros and some are storing ones, obtaining information from the upper page includes setting a voltage in each half to determine the value based on what the lower page value is.

Variations

Various embodiments use various codes that are usable with erasure-based decoding, for example LDPC, RS, and BCH codes.

In some embodiments, the hard-decision and the erasure-based codes are different.

Various embodiments perform ECC over various units, such as a flash memory page, a portion thereof (of a fixed-size or of a variable size), any multiple of a page (an integer multiple or a non-integer multiple), fixed size, and variable size, and other variations. For example, a variable-sized code is achievable by puncturing and shortening the code.

Example Implementation Techniques

In some embodiments, various combinations of all or portions of operations performed by a computing-host flash memory controller or an SSD controller (such as SSD controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments some, all, or various portions of the program instructions are realized as one or more functions, routines, sub-routines, in-line routines, procedures, macros, or portions thereof.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
    requesting, in response to receiving a request for data stored at a particular location in a flash memory, one or more initial reads at the particular location;
    detecting, in response to completing the initial reads, an uncorrectable error via a hard-decision based Low Density Parity Check (LDPC) decoding based on results of the initial reads;
    requesting, in response to the detecting, one or more additional reads at the particular location; and
    performing, in response to completing the additional reads, an erasure-decision LDPC decoding based on respective results of the additional reads.

2. The method of claim 1 wherein the flash memory comprises Single-Level Cell (SLC) technology flash memory, the initial reads are one in number, the additional reads are two in number, and each of the additional reads is at a respective read voltage.

3. The method of claim 2 further comprising providing respective voltage specifiers for each of the additional reads.

4. The method of claim 3 wherein at least one of the voltage specifiers is one of an explicit voltage level, an identifier of one of a plurality of predetermined voltage levels, and a unique identification of one of a plurality of read request types.

5. The method of claim 1 wherein the flash memory comprises Multi-Level Cell (MLC) technology flash memory.

6. The method of claim 1 wherein the receiving is compatible with one or more of a plurality of interface standards, the interface standards comprising
    a Serial Advanced Technology Attachment (SATA) interface standard,
    a Serial Attached Small Computer System Interface (SAS) interface standard,
    a Peripheral Component Interconnect express (PCIe) interface standard,
    a Fibre Channel interface standard, and
    an Ethernet interface standard.

7. The method of claim 1 wherein the requesting initial reads and the requesting additional reads are via a controller, the controller and the flash memory are comprised in a storage sub-system implemented as one of a plurality of non-volatile storage component types, and the non-volatile storage component types comprise
    a Universal Serial Bus (USB) storage component type,
    a Compact Flash (CF) storage component type,
    a MultiMediaCard (MMC) storage component type,
    a Secure Digital (SD) storage component type,
    a Memory Stick storage component type, and
    an xD-picture card storage component type.

8. A system comprising:
    an interface; and
    a controller enabled to
        request, in response to receiving a request via the interface for data stored at a particular location in a flash memory, one or more initial reads at the particular location;

detect, in response to completing the initial reads, an uncorrectable error via a hard-decision based Low Density Parity Check (LDPC) decoding based on results of the initial reads;

request, in response to the detection, one or more additional reads at the particular location; and perform, in response to completing the additional reads, an erasure-decision LDPC decoding based on respective results of the additional reads.

9. The system of claim 8 wherein the flash memory comprises Single-Level Cell (SLC) technology flash memory, the initial reads are one in number, the additional reads are two in number, and each of the additional reads is at a respective read voltage.

10. The system of claim 9 wherein the controller is further enabled to provide respective voltage specifiers for each of the additional reads.

11. The system of claim 10 wherein at least one of the voltage specifiers is one of an explicit voltage level, an identifier of one of a plurality of predetermined voltage levels, and a unique identification of one of a plurality of read request types.

12. The system of claim 8 wherein the flash memory comprises Multi-Level Cell (MLC) technology flash memory.

13. The system of claim 8 wherein the controller and the flash memory are comprised in a storage sub-system implemented as one of a plurality of non-volatile storage component types, and the non-volatile storage component types comprise a Universal Serial Bus (USB) storage component type,
a Compact Flash (CF) storage component type,
a MultiMediaCard (MMC) storage component type,
a Secure Digital (SD) storage component type,
a Memory Stick storage component type, and
an xD-picture card storage component type.

* * * * *